US012563901B2

(12) United States Patent
Shin et al.

(10) Patent No.: US 12,563,901 B2
(45) Date of Patent: **\*Feb. 24, 2026**

(54) DISPLAY DEVICE

(71) Applicant: Samsung Display Co., Ltd., Yongin-Si (KR)

(72) Inventors: Hyeonwoo Shin, Suwon-si (KR); Seokje Seong, Seongnam-si (KR); Yunsik Joo, Goyang-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/948,471

(22) Filed: Nov. 15, 2024

(65) Prior Publication Data

US 2025/0072220 A1    Feb. 27, 2025

Related U.S. Application Data

(63) Continuation of application No. 18/206,011, filed on Jun. 5, 2023, now Pat. No. 12,178,081, which is a (Continued)

(30) Foreign Application Priority Data

Jan. 22, 2021    (KR) ........................ 10-2021-0009419

(51) Int. Cl.
*G09G 3/3233* (2016.01)
*H10K 59/121* (2023.01)
(Continued)

(52) U.S. Cl.
CPC ....... *H10K 59/1216* (2023.02); *G09G 3/3233* (2013.01); *H10K 59/1213* (2023.02);
(Continued)

(58) Field of Classification Search
CPC ............. H10K 59/1216; H10K 59/131; H10K 59/1213; G09G 3/3233; G09G 2300/0426;
(Continued)

(56) References Cited

U.S. PATENT DOCUMENTS 9,349,782 B2    5/2016    Hong
11,289,561 B2    3/2022    Kang et al.
(Continued)

FOREIGN PATENT DOCUMENTS

KR            10-1903741 B1    10/2018
KR    10-2019-0098315 A    8/2019

*Primary Examiner* — Robert J Michaud
(74) *Attorney, Agent, or Firm* — Innovation Counsel LLP

(57) ABSTRACT

A display device is disclosed that may include a first active layer disposed on a substrate, a scan line disposed on the first active layer, extending in a first direction and including a first protruding portion protruding in a second direction crossing the first direction, a first compensation control line disposed on the first active layer, extending in the first direction and spaced apart from the scan line in the second direction, and a second active layer disposed on the scan line and the first compensation control line, overlapping the scan line and the first compensation control line and including a second protruding portion protruding in the first direction. The first protruding portion may be positioned outside the second active layer in the first direction in a plan view.

20 Claims, 22 Drawing Sheets

Related U.S. Application Data continuation of application No. 17/447,283, filed on Sep. 9, 2021, now Pat. No. 11,711,945.

(51) Int. Cl.

| | |
|---|---|
| *H10K 59/131* | (2023.01) |
| *H10D 30/67* | (2025.01) |
| *H10D 86/40* | (2025.01) |
| *H10D 86/60* | (2025.01) |

(52) U.S. Cl.
CPC ..................... *H10K 59/131* (2023.02); *G09G 2300/0426* (2013.01); *G09G 2300/0819* (2013.01); *G09G 2300/0842* (2013.01); *G09G 2330/021* (2013.01); *H10D 30/6731* (2025.01); *H10D 30/6745* (2025.01); *H10D 30/6755* (2025.01); *H10D 86/423* (2025.01); *H10D 86/441* (2025.01); *H10D 86/471* (2025.01); *H10D 86/481* (2025.01); *H10D 86/60* (2025.01)

(58) Field of Classification Search
CPC .............. G09G 2300/0819; G09G 2300/0842; G09G 2330/021; H10D 30/6731; H10D 86/471; H10D 30/6745; H10D 86/441; H10D 86/60; H10D 30/6755; H10D 86/481; H10D 86/423
See application file for complete search history.

(56) References Cited

U.S. PATENT DOCUMENTS

| | | | | |
|---|---|---|---|---|
| 2019/0252479 | A1* | 8/2019 | Kang ................... | H10K 59/131 |
| 2021/0159284 | A1* | 5/2021 | Huang ................ | H10K 59/352 |

* cited by examiner

ACT1

DR1

DR2

110

111

113

112

T7

T2

T1

T5     T6

DR1

DR2

120

122

121

123

CST

DR1

DR2

140

148

144

141

142

143

145

146

DR1

DR2

151 154 152 150

153

DR1

DR2

DISPLAY DEVICE

CROSS-REFERENCE TO RELATED APPLICATION(S)

This application is a continuation of U.S. patent application Ser. No. 18/206,011, filed on Jun. 5, 2023, now U.S. Pat. No. 12,178,081, which is a continuation of U.S. patent application Ser. No. 17/447,283, filed on Sep. 9, 2021, now U.S. Pat. No. 11,711,945, which claims priority under 35 USC § 119 to Korean Patent Application No. 10-2021-0009419 filed on Jan. 22, 2021 in the Korean Intellectual Property Office (KIPO), the entire disclosures of which are incorporated herein by reference.

BACKGROUND

1. Field

The present inventive concept relates to display devices. More particularly, the present inventive concept relates to display devices that include pluralities of transistors.

2. Description of the Related Art

In general, a display device may include a light emitting element and a driving circuit for controlling an electrical signal applied to the light emitting element. The driving circuit may include a transistor, a capacitor, or the like.

The number of transistors electrically connected to one light emitting element is increasing in order to accurately control whether or not the light emitting element emits light and the degree of light emission. Accordingly, research for solving the problem of high integration and power consumption of the display device is being actively conducted.

SUMMARY

A display device according to an embodiment may include a first active layer disposed on a substrate, a scan line disposed on the first active layer, extending in a first direction, and including a first protruding portion protruding in a second direction crossing the first direction, a first compensation control line disposed on the first active layer, extending in the first direction, and spaced apart from the scan line in the second direction, and a second active layer disposed on the scan line and the first compensation control line, overlapping the scan line and the first compensation control line, and including a second protruding portion protruding in the first direction. The first protruding portion may be positioned outside the second active layer in the first direction in a plan view.

In an embodiment, the second protruding portion may be positioned outside the scan line in the second direction in the plan view.

In an embodiment, the first compensation control line may include a third protruding portion protruding in the second direction. The third protruding portion may be positioned outside the second active layer in the first direction in the plan view.

In an embodiment, the scan line and the second active layer may form a boosting capacitor in a region in which the scan line and the second active layer overlap each other.

A display device according to an embodiment may include a first active layer disposed on a substrate, a scan line disposed on the first active layer and extending in a first direction, a first compensation control line disposed on the first active layer, extending in the first direction, and spaced apart from the scan line in a second direction crossing the first direction, and a second active layer disposed on the scan line and the first compensation control line and overlapping the scan line and the first compensation control line. The scan line and the second active layer may form a boosting capacitor in a region in which the scan line and the second active layer overlap each other. A planar area of the boosting capacitor may be determined by a width of the second active layer in the first direction and a width of the scan line in the second direction in the region in which the scan line and the second active layer overlap each other.

In an embodiment, the first compensation control line and the second active layer may form a compensation transistor capacitor in a region in which the first compensation control line and the second active layer overlap each other. A planar area of the compensation transistor capacitor may be determined by a width of the second active layer in the first direction and a width of the first compensation control line in the second direction in the region in which the first compensation control line and the second active layer overlap each other.

In an embodiment, the scan line may be disposed between the first active layer and the first compensation control line.

In an embodiment, the scan line may be disposed on the same layer as the first compensation control line.

In an embodiment, the display device may further include a first conductive pattern disposed on a same layer as the scan line. The first active layer and the first conductive pattern may form a driving transistor.

In an embodiment, the driving transistor may be a p-channel metal oxide semiconductor (PMOS) transistor.

In an embodiment, the display device may further include a second compensation control line disposed on the second active layer, extending in the first direction, and overlapping the first compensation control line. The first compensation control line, the second active layer, and the second compensation control line may form a compensation transistor for compensating a threshold voltage of the driving transistor.

In an embodiment, the compensation transistor may be an n-channel metal oxide semiconductor (NMOS) transistor.

In an embodiment, the display device may further include a first gate connection electrode disposed on the second compensation control line and electrically connecting the first conductive pattern and the second active layer.

In an embodiment, the display device may further include a data line disposed on the first gate connection electrode, extending in the second direction, and transmitting a data voltage applied to the first conductive pattern through the driving transistor and the compensation transistor.

In an embodiment, the display device may further include a first electrode disposed on the data line, an emission layer disposed on the first electrode, and a second electrode disposed on the emission layer. The first electrode, the emission layer, and the second electrode may form a light emitting element emitting a light based on a driving current generated by the driving transistor.

In an embodiment, the display device may further include a first bridge line disposed on the same layer as the first gate connection electrode and extending in the first direction.

In an embodiment, the display device may further include a second bridge line disposed on the same layer as the data line and extending in the second direction.

In an embodiment, the display device may further include a second gate connection electrode disposed on the same layer as the second compensation control line and connecting the first conductive pattern and the first gate connection electrode.

In an embodiment, the display device may further include a second conductive pattern disposed on the same layer as the first compensation control line and overlapping the first conductive pattern. The first conductive pattern and the second conductive pattern may form a storage capacitor in a region in which the first conductive pattern and the second conductive pattern overlap each other.

In an embodiment, the display device may further include a lower wiring disposed between the substrate and the first active layer.

In an embodiment, a material of the first active layer may be different from a material of the second active layer.

In an embodiment, the first active layer may include at least one of amorphous silicon and polycrystalline silicon. The second active layer may include an oxide semiconductor.

BRIEF DESCRIPTION OF THE DRAWINGS

Illustrative, non-limiting embodiments will be more clearly understood from the following detailed description taken in conjunction with the accompanying drawings.

DETAILED DESCRIPTION OF THE EMBODIMENTS

Embodiments provide a display device for preventing occurrence of stains.

In the display device according to the embodiments, the planar area of the boosting capacitor and the planar area of the compensation transistor capacitor may be determined by the width of the second active layer in the first direction, or the scan line and the first compensation control line may be disposed on the same layer, so that deviation of a kickback voltage due to the boosting capacitor and the compensation transistor capacitor may decrease. Accordingly, the occurrence of stains of the display device may be reduced or substantially prevented.

Hereinafter, display devices in accordance with embodiments will be explained in detail with reference to the accompanying drawings.

Figure 1:
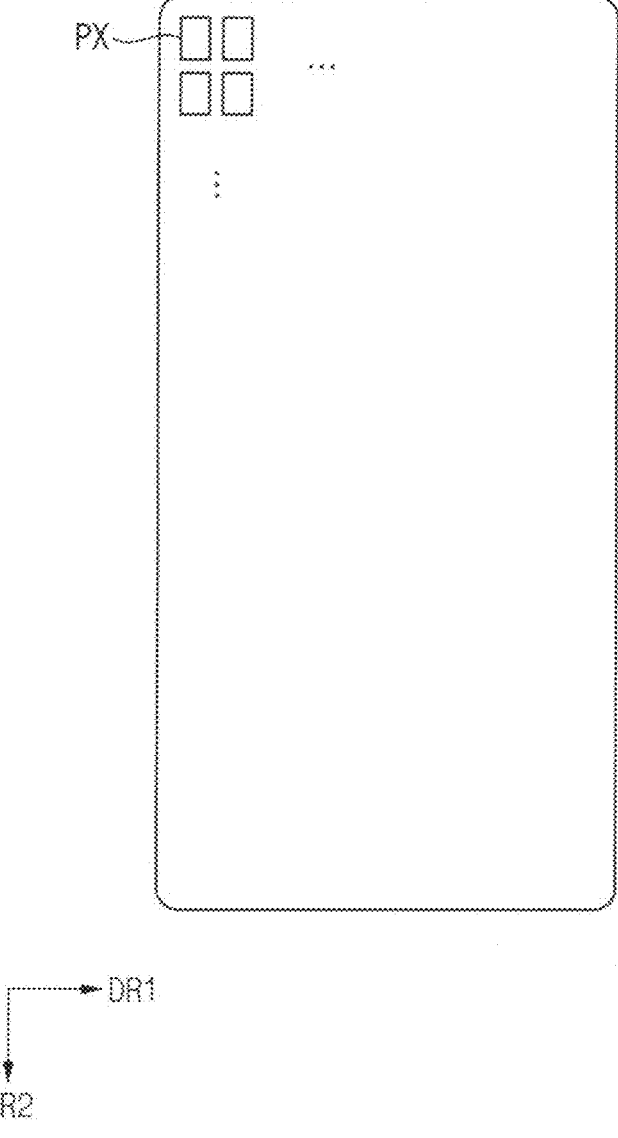
FIG. 1 is a plan view illustrating a display device according to an embodiment.

FIG. 1 is a plan view illustrating a display device according to an embodiment.

Referring to FIG. 1, a display device may include a plurality of pixels PX. Each pixel PX refers to a single area defined by partitioning a display area in a plan view for color display, and one pixel PX may display one predetermined basic color. In other words, one pixel PX may be a minimum unit capable of displaying colors independent from other pixels PX. The pixels PX may be arranged along a first direction DR1 and a second direction DR2 crossing the first direction DR1. In an embodiment, the first direction DR1 and the second direction DR2 may be a pixel row direction and a pixel column direction, respectively. In another embodiment, the first direction DR1 and the second direction DR2 may be the pixel column direction and the pixel row direction, respectively.

Figure 2:
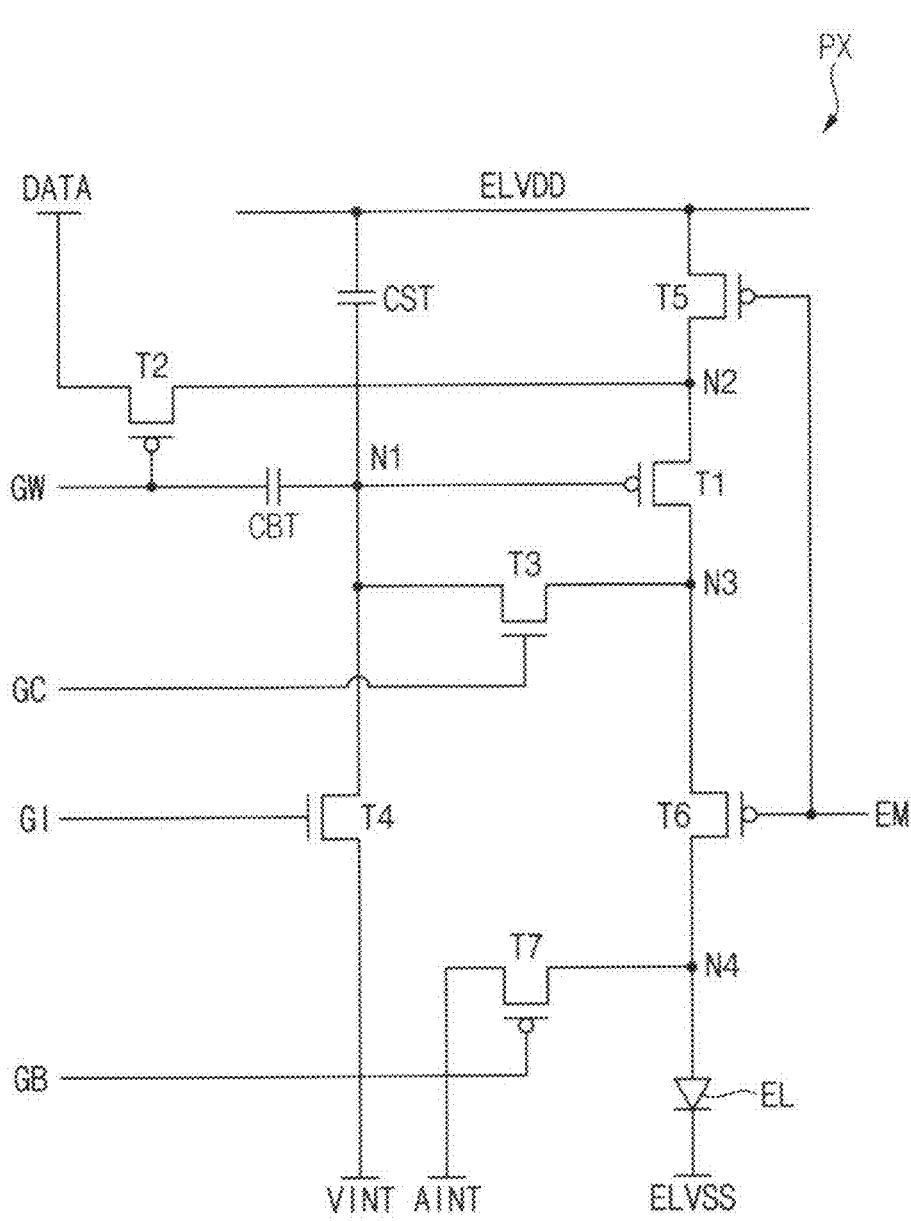
FIG. 2 is a circuit diagram illustrating a pixel of the display device in FIG. 1.

FIG. 2 is a circuit diagram illustrating the pixel PX of the display device in FIG. 1.

Referring to FIG. 2, the pixel PX may include a plurality of transistors, a storage capacitor CST, a boosting capacitor CBT, and a light emitting element EL. In an embodiment, the plurality of transistors may include a driving transistor T1, a switching transistor T2, a compensation transistor T3, a first initialization transistor T4, a first emission control transistor T5, a second emission control transistor T6, and a second initialization transistor T7. However, the present inventive concept is not limited thereto, and in another embodiment, the plurality of transistors may include 2 to 6 or 8 or more transistors.

A gate electrode of the driving transistor T1 may be connected to a first node N1. A first electrode of the driving transistor T1 may be connected to a second node N2, and a second electrode of the driving transistor T1 may be connected to a third node N3. The driving transistor T1 may generate a driving current based on a voltage between the first node N1 and the second node N2.

A gate electrode of the switching transistor T2 may receive a scan signal GW. A first electrode of the switching transistor T2 may receive a data voltage DATA, and a second electrode of the switching transistor T2 may be connected to the second node N2. The switching transistor T2 may transmit the data voltage DATA to the second node N2 based on the scan signal GW.

A gate electrode of the compensation transistor T3 may receive a compensation control signal GC. A first electrode of the compensation transistor T3 may be connected to the third node N3, and a second electrode of the compensation transistor T3 may be connected to the first node N1. The compensation transistor T3 may compensate a threshold voltage of the driving transistor T1 by connecting the first node N1 and the third node N3 based on the compensation control signal GC.

A gate electrode of the first initialization transistor T4 may receive a first initialization control signal GI. A first electrode of the first initialization transistor T4 may receive a first initialization voltage VINT, and a second electrode of the first initialization transistor T4 may be connected to the first node N1. The first initialization transistor T4 may initialize the gate electrode of the driving transistor T1 by transmitting the first initialization voltage VINT to the first node N1 based on the first initialization control signal GI.

A gate electrode of the first emission control transistor T5 may receive an emission control signal EM. A first electrode of the first emission control transistor T5 may receive a driving voltage ELVDD, and a second electrode of the first emission control transistor T5 may be connected to the second node N2.

A gate electrode of the second emission control transistor T6 may receive the emission control signal EM. A first electrode of the second emission control transistor T6 may be connected to the third node N3, and a second electrode of the second emission control transistor T6 may be connected to a fourth node N4. The first emission control transistor T5 and the second emission control transistor T6 may transmit the driving current generated by the driving transistor T1 to the light emitting element EL based on the emission control signal EM.

A gate electrode of the second initialization transistor T7 may receive a second initialization control signal GB. A first electrode of the second initialization transistor T7 may receive a second initialization voltage AINT, and a second electrode of the second initialization transistor T7 may be connected to the fourth node N4. In an embodiment, when the pixel PX is included in an N-th pixel row, the second initialization control signal GB may be a scan signal GW applied to an (N+1)-th pixel row. The second initialization transistor T7 may initialize the light emitting element EL by transmitting the second initialization voltage AINT to the fourth node N4 based on the second initialization control signal GB.

In an embodiment, each of the driving transistor T1, the switching transistor T2, the first emission control transistor T5, the second emission control transistor T6, and the second initialization transistor T7 may be a transistor having a single gate structure, and each of the compensation transistor T3 and the first initialization transistor T4 may be a transistor having a double gate structure. In such an embodiment, the gate electrode of each of the compensation transistor T3 and the first initialization transistor T4 may include a lower gate electrode and an upper gate electrode, and the lower gate electrode and the upper gate electrode may be electrically connected.

In an embodiment, an active layer of each of the driving transistor T1, the switching transistor T2, the first emission control transistor T5, the second emission control transistor T6, and the second initialization transistor T7 may be formed of amorphous silicon or polycrystalline silicon, and an active layer of each of the compensation transistor T3 and the first initialization transistor T4 may be formed of an oxide semiconductor. In an embodiment, each of the driving transistor T1, the switching transistor T2, the first emission control transistor T5, the second emission control transistor T6, and the second initialization transistor T7 may be a p-channel metal oxide semiconductor (PMOS) transistor, and each of the compensation transistor T3 and the first initialization transistor T4 may be an n-channel metal oxide semiconductor (NMOS) transistor.

A first electrode of the storage capacitor CST may receive the driving voltage ELVDD, and a second electrode of the storage capacitor CST may be connected to the first node N1. The storage capacitor CST may maintain a voltage between the first node N1 and the second node N2 when the switching transistor T2 is turned off, so that the light emitting element EL may emit light.

A first electrode of the boosting capacitor CBT may receive the scan signal GW, and a second electrode of the boosting capacitor CBT may be connected to the first node N1. When the scan signal GW is at a voltage level which turns off the switching transistor T2, the boosting capacitor CBT may increase the voltage of the first node N1 to reduce a voltage for displaying black (black voltage). Accordingly, power consumption of the pixel PX may be reduced.

A first electrode of the light emitting element EL may be connected to the fourth node N4, and a second electrode of the light emitting element EL may receive a common voltage ELVSS. In an embodiment, a voltage level of the common voltage ELVSS may be lower than a voltage level of the driving voltage ELVDD. The light emitting element EL may emit light based on the driving current.

Figure 3:
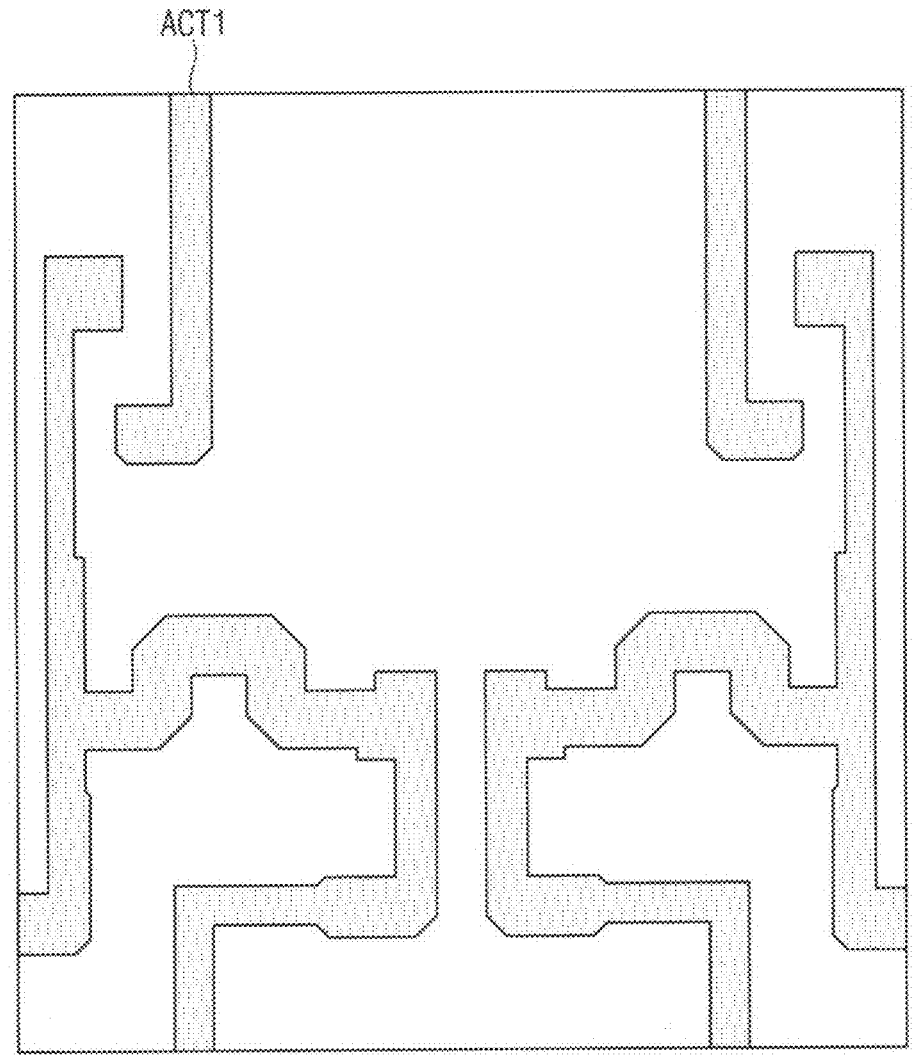
FIG. 3 is a plan view illustrating a first active layer of a display device according to an embodiment.
Figure 3:
Figure 4:
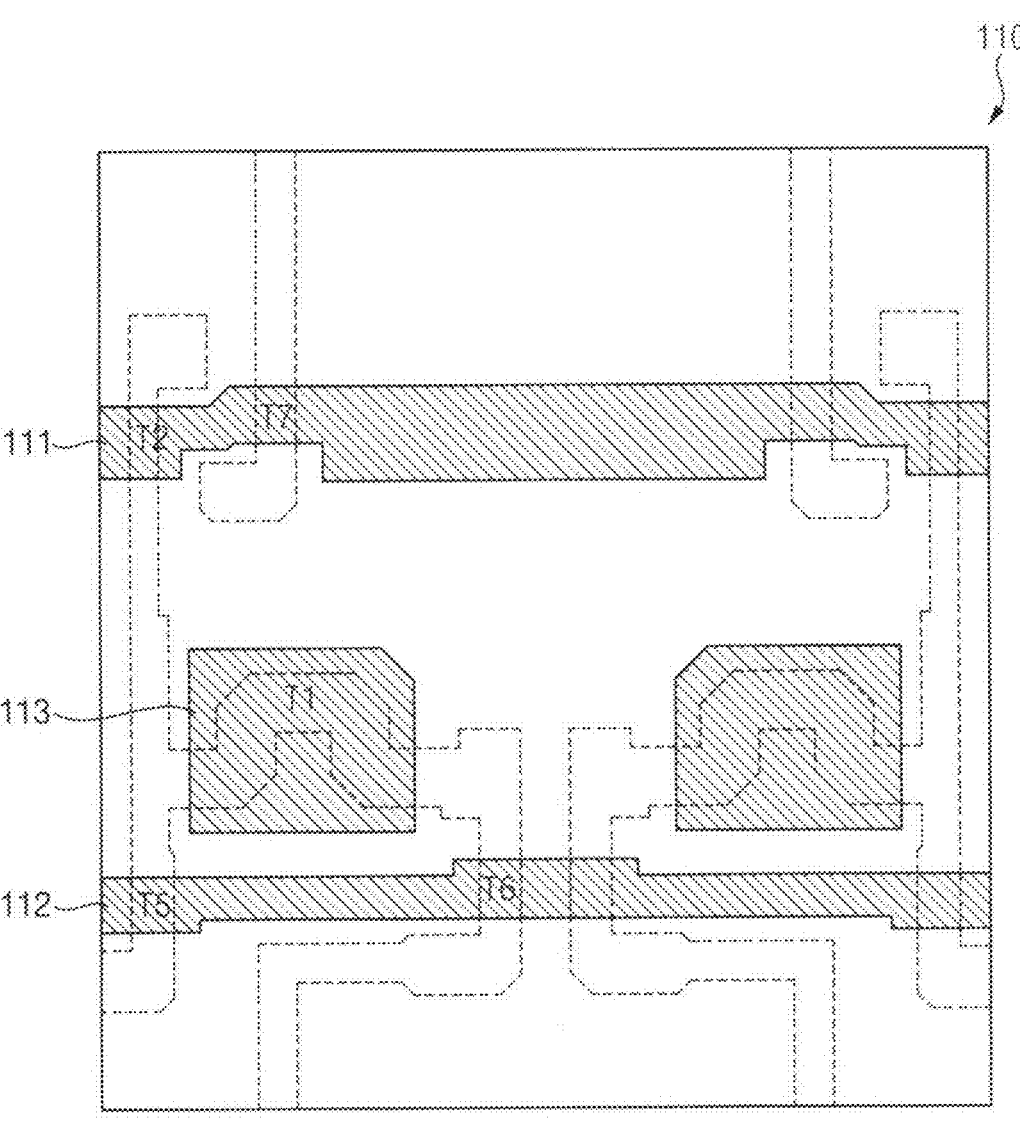
FIG. 4 is a plan view illustrating a first conductive layer of a display device according to an embodiment.
Figure 4:
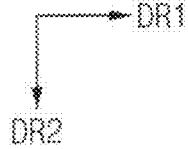
Figure 5:
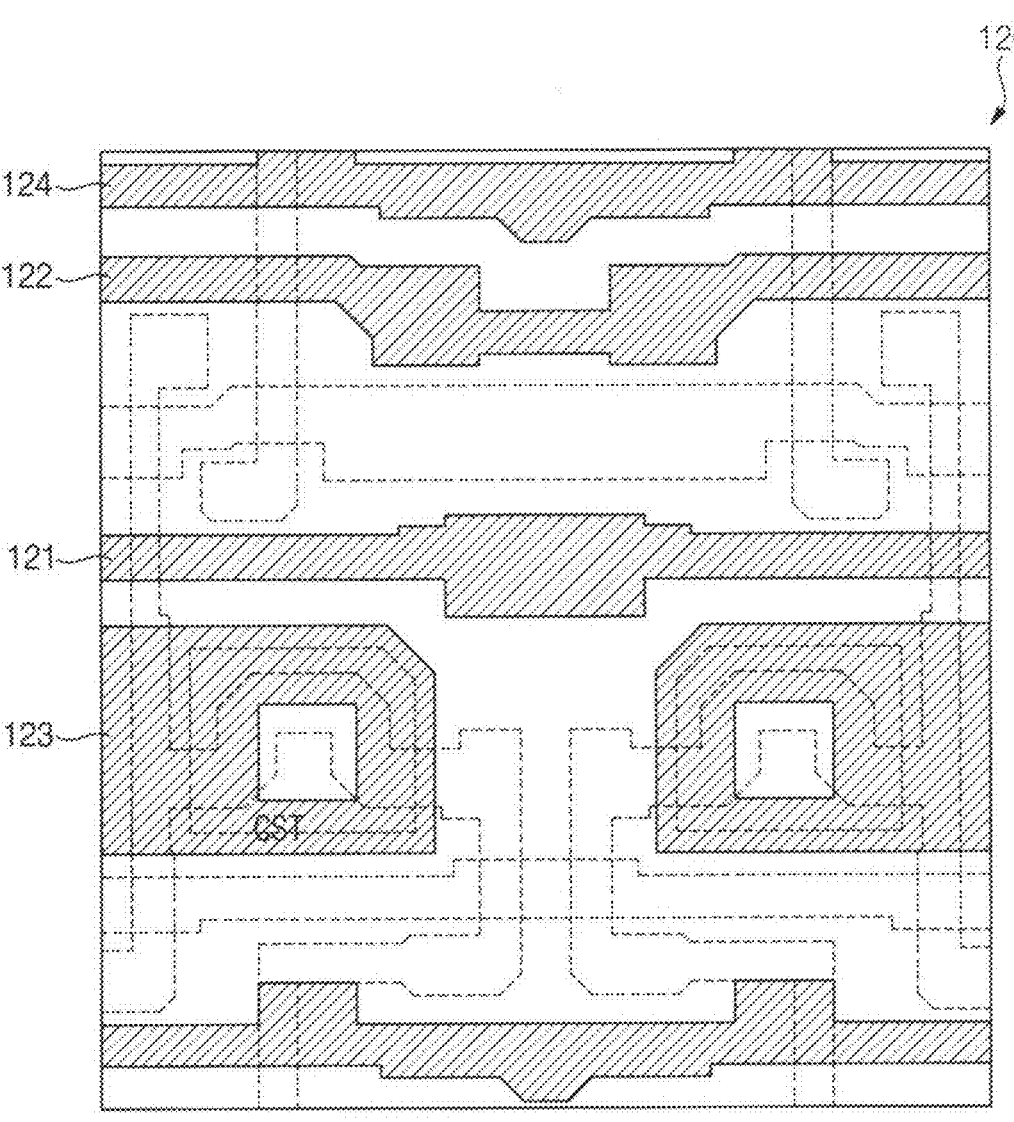
FIG. 5 is a plan view illustrating a second conductive layer of a display device according to an embodiment.
Figure 5:
Figure 6:
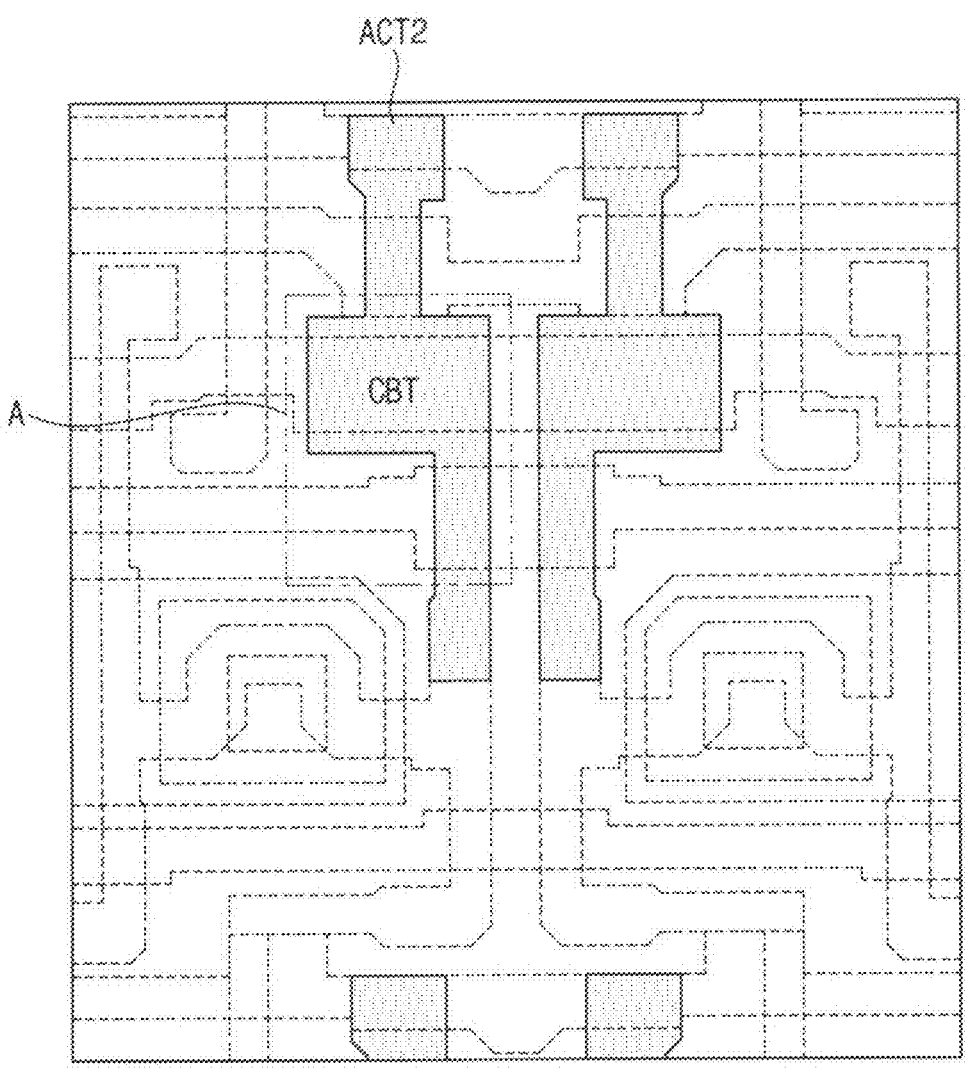
FIG. 6 is a plan view illustrating a second active layer of a display device according to an embodiment.
Figure 6:
Figure 7:
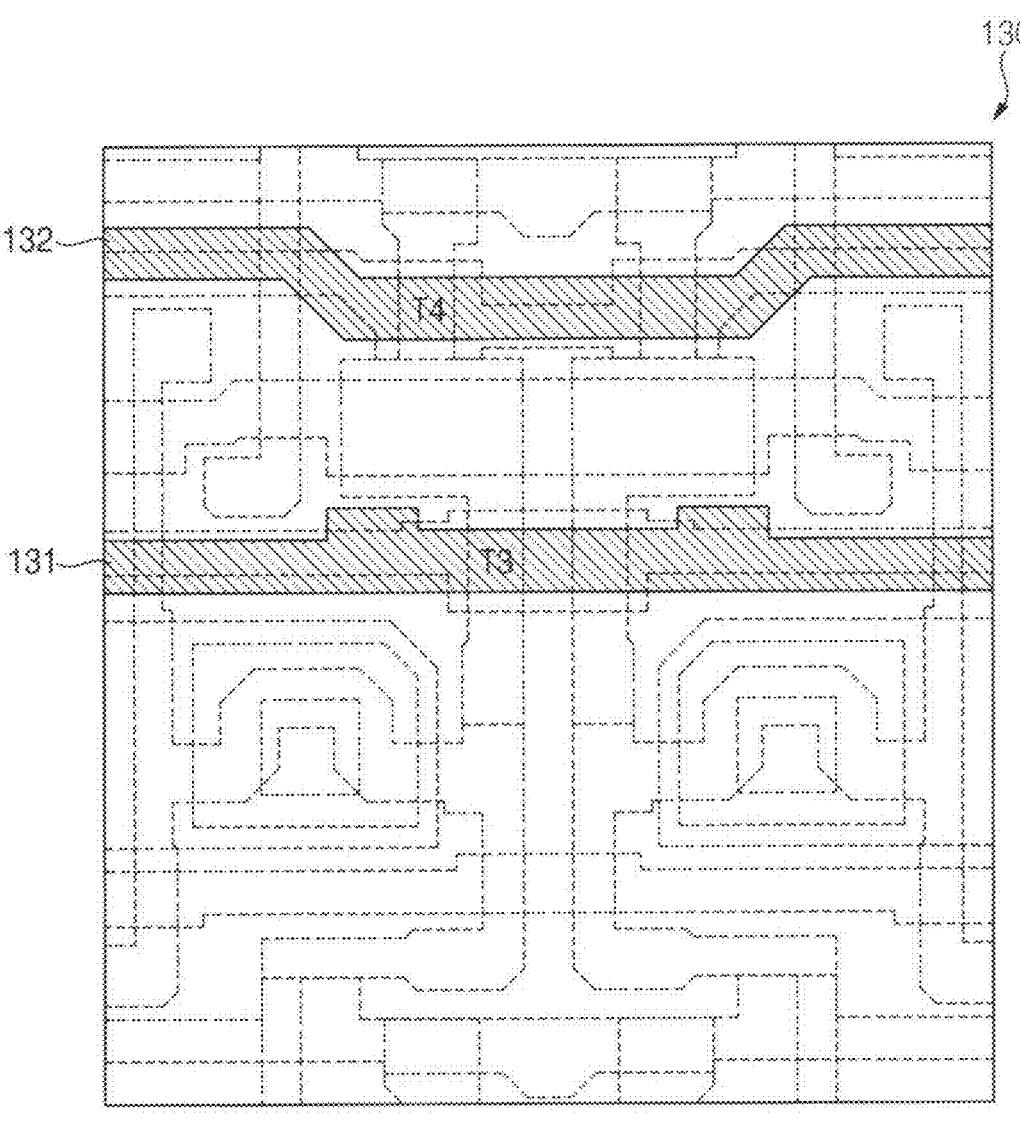
FIG. 7 is a plan view illustrating a third conductive layer of a display device according to an embodiment.
Figure 7:
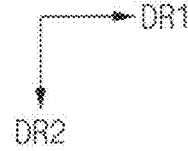
Figure 8:
FIG. 8 is a plan view illustrating a fourth conductive layer of a display device according to an embodiment.
Figure 9:
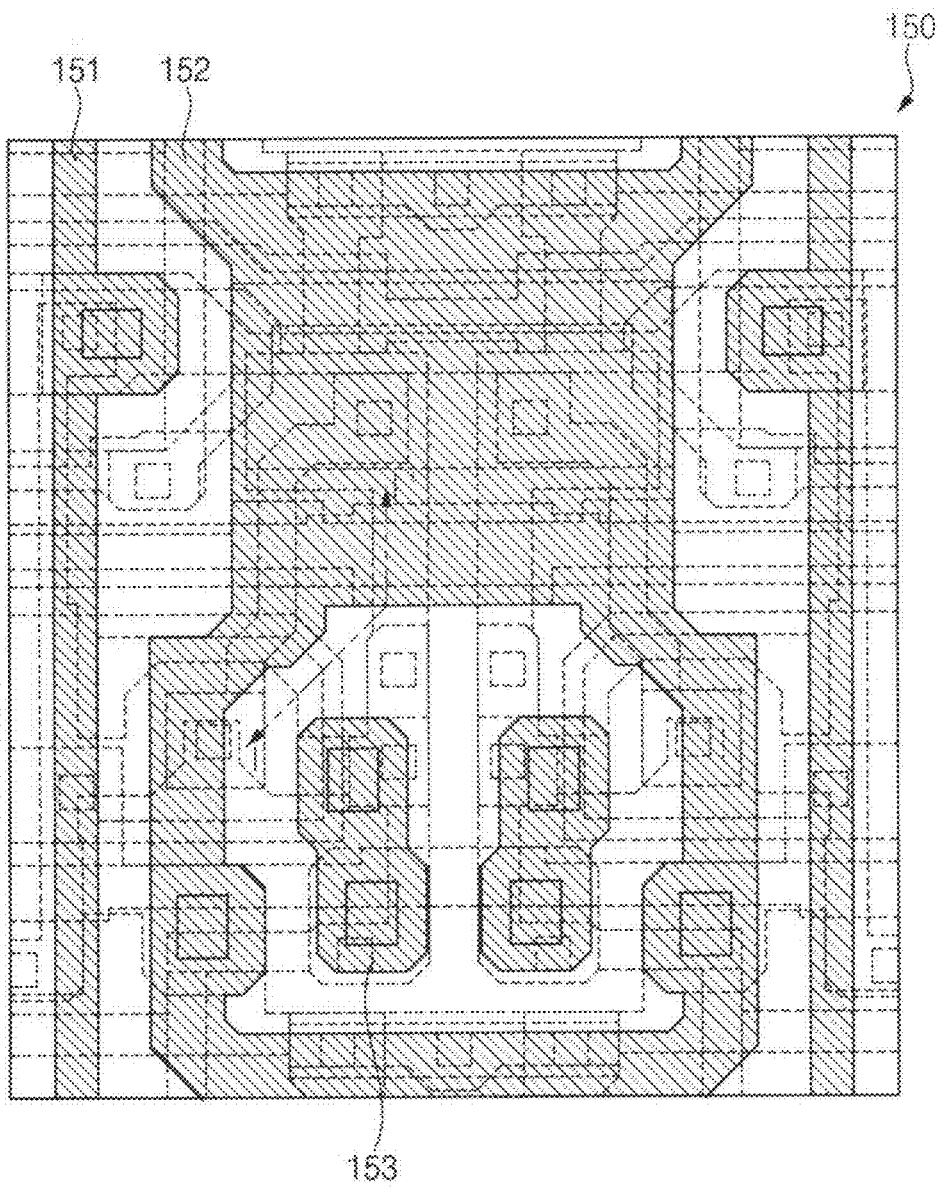
FIG. 9 is a plan view illustrating a fifth conductive layer of a display device according to an embodiment.
Figure 9:
Figure 10:
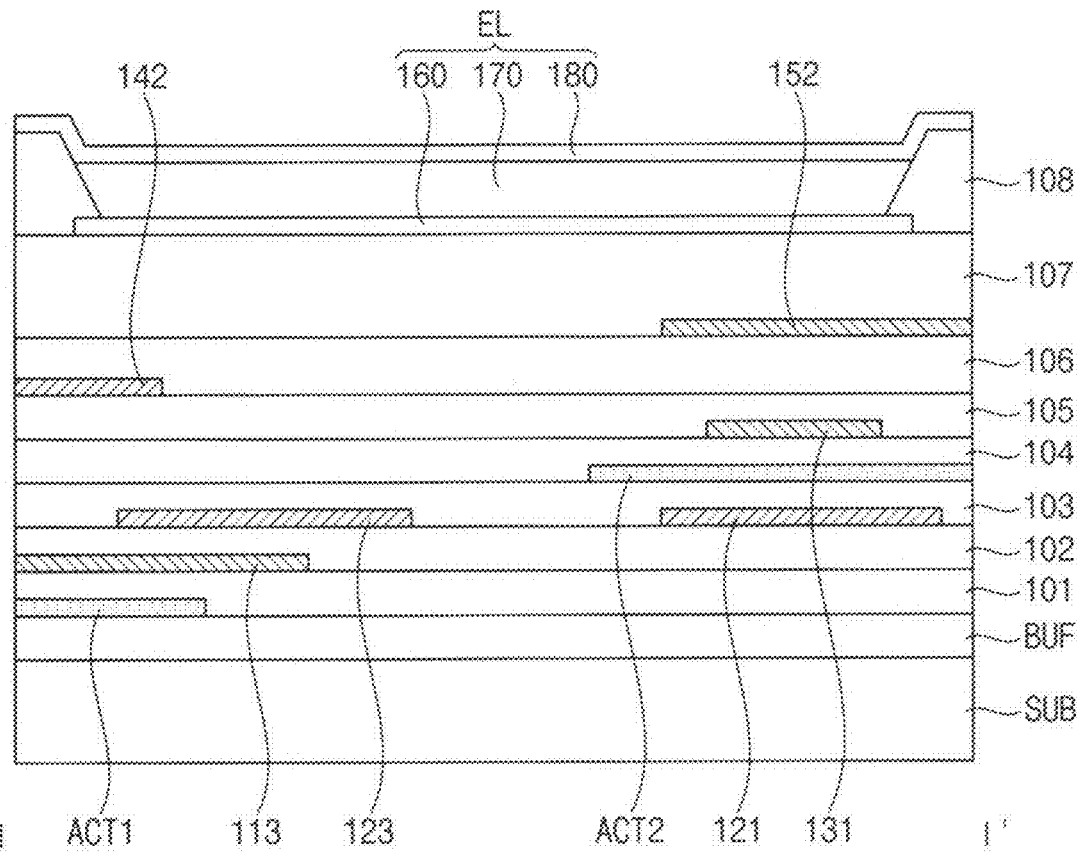
FIG. 10 is a cross-sectional view illustrating the display device taken along a line I-I' in FIG. 9.

FIG. 3 is a plan view illustrating a first active layer ACT1 of a display device according to an embodiment. FIG. 4 is a plan view illustrating a first conductive layer 110 of a display device according to an embodiment. FIG. 5 is a plan view illustrating a second conductive layer 120 of a display device according to an embodiment. FIG. 6 is a plan view illustrating a second active layer ACT2 of a display device according to an embodiment. FIG. 7 is a plan view illustrating a third conductive layer 130 of a display device according to an embodiment. FIG. 8 is a plan view illustrating a fourth conductive layer 140 of a display device according to an embodiment. FIG. 9 is a plan view illustrating a fifth conductive layer 150 of a display device according to an embodiment. FIG. 10 is a cross-sectional view illustrating the display device taken along a line I-I' in FIG. 9.

Referring to FIGS. 3, 4, 5, 6, 7, 8, 9, and 10, a display device may include a first active layer ACT1, a first conductive layer 110, a second conductive layer 120, a second active layer ACT2, a third conductive layer 130, a fourth conductive layer 140, a fifth conductive layer 150, a first electrode 160, an emission layer 170, and a second electrode 180, which are disposed on a substrate SUB.

The substrate SUB may be an insulating substrate including glass, quartz, plastic, or the like. In an embodiment, the substrate SUB may include a first flexible layer, a first barrier layer disposed on the first flexible layer, a second flexible layer disposed on the first barrier layer, and a second barrier layer disposed on the second flexible layer. The first flexible layer and the second flexible layer may include an organic insulation material such as polyimide (PI) or the like, and the first barrier layer and the second barrier layer may include an inorganic insulation material such as silicon oxide, silicon nitride, amorphous silicon, or the like.

The first active layer ACT1 may be disposed on the substrate SUB.

A buffer layer BUF may be disposed between the substrate SUB and the first active layer ACT1. The buffer layer BUF may block diffusion of impurities such as oxygen, moisture, etc. through the substrate SUB to above the substrate SUB. Further, the buffer layer BUF may provide a planarized upper surface on the substrate SUB. The buffer layer BUF may include an inorganic insulation material such as silicon oxide, silicon nitride, silicon oxynitride, or the like. Alternatively, the buffer layer BUF may be omitted.

The first conductive layer 110 may be disposed on the first active layer ACT1. The first conductive layer 110 may include a conductive material such as molybdenum (Mo), copper (Cu), aluminum (Al), titanium (Ti), or the like.

The first conductive layer 110 may include a scan line 111, an emission control line 112, and a first conductive pattern 113. The scan line 111 may extend in the first direction DR1. The emission control line 112 may be spaced apart from the scan line 111, and may extend in the first direction DR1. The first conductive pattern 113 may be positioned between the scan line 111 and the emission control line 112.

A first portion of the scan line 111 overlapping the first active layer ACT1 may form the gate electrode of the switching transistor T2, and a second portion of the scan line 111 overlapping the first active layer ACT1 may form the gate electrode of the second initialization transistor T7. In an embodiment, when the pixel PX is included in the N-th pixel row, the second portion of the scan line 111 may form the gate electrode of the second initialization transistor T7 of the pixel included in an (N−1)-th pixel row. A portion of the first active layer ACT1 overlapping the gate electrode of the switching transistor T2 may be a channel region of the switching transistor T2, and a portion of the first active layer ACT1 overlapping the gate electrode of the second initialization transistor T7 may be a channel region of the second initialization transistor T7. Accordingly, the first active layer ACT1 and the first portion of the scan line 111 may form the switching transistor T2, and the first active layer ACT1 and the second portion of the scan line 111 may form the second initialization transistor T7.

A first portion of the emission control line 112 overlapping the first active layer ACT1 may form the gate electrode of the first emission control transistor T5, and a second portion of the emission control line 112 overlapping the first active layer ACT1 may form the gate electrode of the second emission control transistor T6. A portion of the first active layer ACT1 overlapping the gate electrode of the first emission control transistor T5 may be a channel region of the first emission control transistor T5, and a portion of the first active layer ACT1 overlapping the gate electrode the second emission control transistor T6 may be a channel region of the second emission control transistor T6. Accordingly, the first active layer ACT1 and the first portion of the emission control line 112 may form the first emission control transistor T5, and the first active layer ACT1 and the second portion of the emission control line 112 may form the second emission control transistor T6.

A portion of the first conductive pattern 113 overlapping the first active layer ACT1 may form the gate electrode of the driving transistor T1. A portion of the first active layer ACT1 overlapping the gate electrode of the driving transistor T1 may be a channel region of the driving transistor T1. Accordingly, the first active layer ACT1 and the portion of the first conductive pattern 113 may form the driving transistor T1.

A first insulation layer 101 may be disposed between the first active layer ACT1 and the first conductive layer 110. The first insulation layer 101 may include an inorganic insulation material such as silicon oxide, silicon nitride, silicon oxynitride, or the like.

The second conductive layer 120 may be disposed on the first conductive layer 110. The second conductive layer 120 may include a conductive material such as molybdenum (Mo), copper (Cu), aluminum (Al), titanium (Ti), or the like.

The second conductive layer 120 may include a first compensation control line 121, a first initialization control line 122, a second conductive pattern 123, and a first initialization voltage line 124. The first compensation control line 121 may extend in the first direction DR1. The first initialization control line 122 may be spaced apart from the first compensation control line 121, and may extend in the first direction DR1. The second conductive pattern 123 may be spaced apart from the first compensation control line 121. The first initialization voltage line 124 may be spaced apart from the first initialization control line 122, and may extend in the first direction DR1.

The second conductive pattern 123 may overlap the first conductive pattern 113. The first conductive pattern 113 and the second conductive pattern 123 may form the storage capacitor CST in a region in which the first conductive pattern 113 and the second conductive pattern 123 overlap each other.

A second insulation layer 102 may be disposed between the first conductive layer 110 and the second conductive layer 120. The second insulation layer 102 may include an inorganic insulation material such as silicon oxide, silicon nitride, silicon oxynitride, or the like.

The second active layer ACT2 may be disposed on the second conductive layer 120. The second active layer ACT2 may not overlap the first active layer ACT1. A material of the first active layer ACT1 may be different from a material of the second active layer ACT2. In an embodiment, the first active layer ACT1 may include at least one of amorphous silicon and polycrystalline silicon, and the second active layer ACT2 may include an oxide semiconductor. However, the present inventive concept is not limited thereto, and in another embodiment, the first active layer ACT1 may include an oxide semiconductor, and the second active layer ACT2 may include at least one of amorphous silicon and polycrystalline silicon.

A third insulation layer 103 may be disposed between the second conductive layer 120 and the second active layer ACT2. The third insulation layer 103 may include an inorganic insulation material such as silicon oxide, silicon nitride, silicon oxynitride, or the like.

The third conductive layer 130 may be disposed on the second active layer ACT2. The third conductive layer 130 may include a conductive material such as molybdenum (Mo), copper (Cu), aluminum (Al), titanium (Ti), or the like.

The third conductive layer 130 may include a second compensation control line 131 and a second initialization control line 132. The second compensation control line 131 may extend in the first direction DR1. The second initialization control line 132 may be spaced apart from the second compensation control line 131, and may extend in the first direction DR1. The second compensation control line 131 and the second initialization control line 132 may overlap the first compensation control line 121 and the first initialization control line 122, respectively.

A portion of the first compensation control line 121 overlapping the second active layer ACT2 may form a lower gate electrode of the compensation transistor T3, and a portion of the second compensation control line 131 overlapping the second active layer ACT2 may form an upper gate electrode of the compensation transistor T3. A portion of the second active layer ACT2 overlapping the lower gate electrode and the upper gate electrode of the compensation transistor T3 may be a channel region of the compensation transistor T3. Accordingly, the portion of the first compensation control line 121, the second active layer ACT2, and the portion of the second compensation control line 131 may form the compensation transistor T3. The compensation transistor T3 may be a transistor having a double gate structure.

A portion of the first initialization control line 122 overlapping the second active layer ACT2 may form a lower gate electrode of the first initialization transistor T4, and a portion of the second initialization control line 132 overlapping the second active layer ACT2 may form an upper gate electrode of the first initialization transistor T4. A portion of the second active layer ACT2 overlapping the lower gate electrode and the upper gate electrode of the first initialization transistor T4 may be a channel region of the first initialization transistor T4. Accordingly, the portion of the first initialization control line 122, the second active layer ACT2, and the portion of the second initialization control line 132 may form the first initialization transistor T4. The first initialization transistor T4 may be a transistor having a double gate structure.

A fourth insulation layer 104 may be disposed between the second active layer ACT2 and the third conductive layer 130. The fourth insulation layer 104 may include an inorganic insulation material such as silicon oxide, silicon nitride, silicon oxynitride, or the like.

The fourth conductive layer 140 may be disposed on the third conductive layer 130. The fourth conductive layer 140 may include a conductive material such as aluminum (Al), titanium (Ti), copper (Cu), or the like. In an embodiment, the fourth conductive layer 140 may have a multilayer structure including a titanium layer, an aluminum layer, and a titanium layer, which are stacked.

The fourth conductive layer 140 may include a second initialization voltage line 141, a first gate connection electrode 142, an active connection electrode 143, a data connection electrode 144, a driving voltage connection electrode 145, a first light emitting element connection electrode 146, and a first initialization voltage connection electrode 147. The second initialization voltage line 141 may extend in the first direction DR1. The second initialization voltage line 141 may be connected to the first active layer ACT1 through a contact hole. Specifically, the second initialization voltage line 141 may be connected to the first electrode of the second initialization transistor T7.

The first gate connection electrode 142 may be spaced apart from the second initialization voltage line 141. The first gate connection electrode 142 may be connected to the first conductive pattern 113 and the second active layer ACT2 through contact holes, respectively. Specifically, the first gate connection electrode 142 may connect the gate electrode of the driving transistor T1, the second electrode of the compensation transistor T3, and the second electrode of the first initialization transistor T4.

The active connection electrode 143 may be spaced apart from the first gate connection electrode 142. The active connection electrode 143 may be connected to the first active layer ACT1 and the second active layer ACT2 through contact holes, respectively. Specifically, the active connection electrode 143 may connect the second electrode of the driving transistor T1, the first electrode of the compensation transistor T3, and the first electrode of the second emission control transistor T6.

The data connection electrode 144 may be spaced apart from the active connection electrode 143. The data connection electrode 144 may be connected to the first active layer ACT1 through a contact hole. Specifically, the data connection electrode 144 may be connected to the first electrode of the switching transistor T2.

The driving voltage connection electrode 145 may be spaced apart from the data connection electrode 144. The driving voltage connection electrode 145 may be connected to the first active layer ACT1 and the second conductive pattern 123 through contact holes, respectively. Specifically, the driving voltage connection electrode 145 may be connected to the first electrode of the first emission control transistor T5 and the first electrode of the storage capacitor CST.

The first light emitting element connection electrode 146 may be spaced apart from the driving voltage connection electrode 145. The first light emitting element connection electrode 146 may be connected to the first active layer ACT1 through a contact hole. Specifically, the first light emitting element connection electrode 146 may be connected to the second electrode of the second emission control transistor T6.

The first initialization voltage connection electrode 147 may be spaced apart from the first light emitting element connection electrode 146. The first initialization voltage connection electrode 147 may be connected to the first initialization voltage line 124 and the second active layer ACT2 through contact holes, respectively. Specifically, the first initialization voltage connection electrode 147 may be connected to the first electrode of the first initialization transistor T4.

A fifth insulation layer 105 may be disposed between the third conductive layer 130 and the fourth conductive layer 140. The fifth insulation layer 105 may include an inorganic insulation material such as silicon oxide, silicon nitride, silicon oxynitride, etc. and/or an organic insulation material such as polyimide (PI), etc.

The fifth conductive layer 150 may be disposed on the fourth conductive layer 140. The fifth conductive layer 150 may include a conductive material such as aluminum (Al), titanium (Ti), copper (Cu), or the like. In an embodiment, the fifth conductive layer 150 may have a multilayer structure including a titanium layer, an aluminum layer, and a titanium layer, which are stacked.

The fifth conductive layer 150 may include a data line 151, a driving voltage line 152, and a second light emitting element connection electrode 153. The data line 151 may extend in the second direction DR2. The data line 151 may be connected to the data connection electrode 144 through a contact hole. Accordingly, the data line 151 may be connected to the first electrode of the switching transistor T2 by the data connection electrode 144.

The driving voltage line 152 may be spaced apart from the data line 151, and may extend in the second direction DR2. The driving voltage line 152 may be connected to the driving voltage connection electrode 145 through a contact hole. Accordingly, the driving voltage line 152 may be connected to the first electrode of the first emission control transistor T5 and the first electrode of the storage capacitor CST by the driving voltage connection electrode 145.

The second light emitting element connection electrode 153 may be spaced apart from the driving voltage line 152. The second light emitting element connection electrode 153 may be connected to the first light emitting element connection electrode 146 through a contact hole.

A sixth insulation layer 106 may be disposed between the fourth conductive layer 140 and the fifth conductive layer 150. The sixth insulation layer 106 may include an inorganic insulation material such as silicon oxide, silicon nitride, silicon oxynitride, etc. and/or an organic insulation material such as polyimide (PI), etc.

The first electrode 160 may be disposed on the fifth conductive layer 150. The first electrode 160 may include a conductive material such as a metal, an alloy, a transparent conductive oxide, or the like. For example, the first electrode 160 may include silver (Ag), indium tin oxide (ITO), or the like. In an embodiment, the first electrode 160 may have a multilayer structure including an indium tin oxide layer, a silver layer, and an indium tin oxide layer, which are stacked.

The first electrode 160 may be connected to the second light emitting element connection electrode 153 through a contact hole. Accordingly, the first electrode 160 may be connected to the second electrode of the second emission control transistor T6 by the first light emitting element connection electrode 146 and the second light emitting element connection electrode 153.

A seventh insulation layer 107 may be disposed between the fifth conductive layer 150 and the first electrode 160. The seventh insulation layer 107 may include an inorganic insulation material such as silicon oxide, silicon nitride, silicon oxynitride, etc. and/or an organic insulation material such as polyimide (PI), etc.

An eighth insulation layer 108 may be disposed on the first electrode 160. The eighth insulation layer 108 may cover the first electrode 160, and may be disposed on the seventh insulation layer 107. The eighth insulation layer 108 may have a pixel opening exposing at least a portion of the first electrode 160. In an embodiment, the pixel opening may expose a central portion of the first electrode 160, and the eighth insulation layer 108 may cover a peripheral portion of the first electrode 160. The eighth insulation layer 108 may include an organic insulation material such as polyimide (PI) or the like.

The emission layer 170 may be disposed on the first electrode 160. The emission layer 170 may be disposed on the first electrode 160 exposed by the pixel opening. The emission layer 170 may include at least one of an organic light emitting material and a quantum dot.

In an embodiment, the organic light emitting material may include a low molecular weight organic compound or a high molecular weight organic compound. For example, the low molecular weight organic compound may include copper phthalocyanine, N,N'-diphenylbenzidine, tris-(8-hydroxy-quinoline)aluminum, or the like, and the high molecular organic compound may include poly(3,4-ethylenedioxythio-phene), polyaniline, polyphenylenevinylene, polyfluorene, or the like.

In an embodiment, the quantum dot may include a core including a group II-VI compound, a group III-V compound, a group IV-VI compound, a group IV element, a group IV compound, and combinations thereof. In an embodiment, the quantum dot may have a core-shell structure including a core and a shell surrounding the core. The shell may serve as a protective layer for maintaining semiconductor proper-ties by preventing chemical modification of the core, and as a charging layer for imparting electrophoretic properties to the quantum dot.

The second electrode 180 may be disposed on the emis-sion layer 170. In an embodiment, the second electrode 180 may also be disposed on the eighth insulation layer 108. The second electrode 180 may include a conductive material such as a metal, an alloy, a transparent conductive oxide, or the like. For example, the second electrode 180 may include aluminum (Al), platinum (Pt), silver (Ag), magnesium (Mg), gold (Au), chromium (Cr), tungsten (W), titanium (Ti), or the like. The first electrode 160, the emission layer 170, and the second electrode 180 may form the light emitting element EL.

Figure 11:
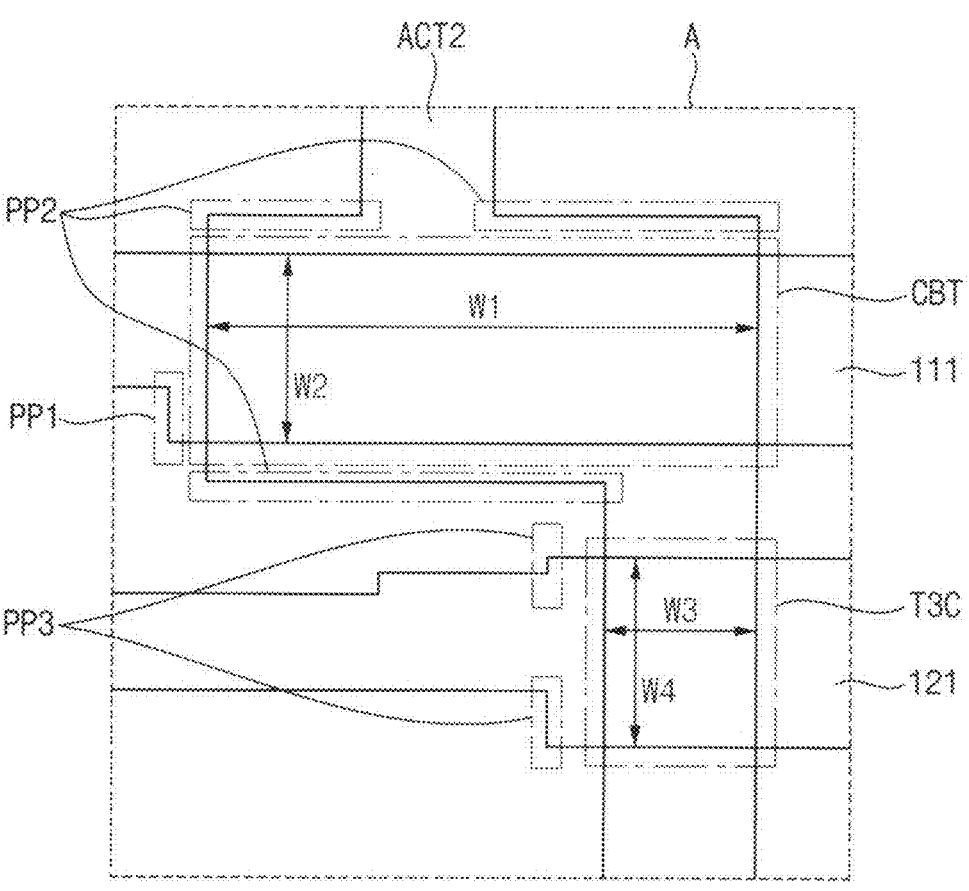
FIG. 11 is a layout view illustrating a region A in FIG. 6.
Figure 11:
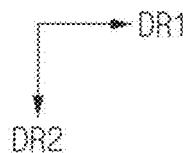

FIG. 11 is a layout view illustrating a region A in FIG. 6. FIG. 11 illustrates only the scan line 111, the first compen-sation control line 121, and the second active layer ACT2 among the components disposed in the region A.

Referring to FIGS. 3, 4, 5, 6, and 11, the first compen-sation control line 121 may be disposed on the scan line 111. In other words, the scan line 111 may be disposed between the first active layer ACT1 and the first compensation control line 121. The first compensation control line 121 may be spaced apart from the scan line 111 in the second direction DR2 in a plan view.

The second active layer ACT2 may be disposed on the scan line 111 and the first compensation control line 121. The second active layer ACT2 may overlap the scan line 111 and the first compensation control line 121.

The scan line 111 and the second active layer ACT2 may form the boosting capacitor CBT in a region in which the scan line 111 and the second active layer ACT2 overlap each other. A planar area of the boosting capacitor CBT may be determined by a width W1 of the second active layer ACT2 in the first direction DR1 and a width W2 of the scan line 111 in the second direction DR2 in the region in which the scan line 111 and the second active layer ACT2 overlap each other. Specifically, the region, in which the scan line 111 and the second active layer ACT2 overlap each other, may have a substantially rectangular shape. A first side of the rectan-gular shape may correspond to the width W1 of the second active layer ACT2 in the first direction DR1, and a second side of the rectangular shape perpendicular to the first side may correspond to the width W2 of the scan line 111 in the second direction DR2.

The scan line 111 may include a first protruding portion PP1 protruding in the second direction DR2. Specifically, the first protruding portion PP1 may be defined as a portion of the scan line 111 which protrudes in the second direction DR2 or in a direction opposite to the second direction DR2. The first protruding portion PP1 may be positioned outside the second active layer ACT2 in the first direction DR1 in a plan view. Accordingly, a width of the boosting capacitor CBT in the first direction DR1 may be determined by the width W1 of the second active layer ACT2 in the first direction DR1 in the region in which the scan line 111 and the second active layer ACT2 overlap each other.

The second active layer ACT2 may include a second protruding portion PP2 protruding in the first direction DR1. Specifically, the second protruding portion PP2 may be defined as a portion of the second active layer ACT2 which protrudes in the first direction DR1 or in a direction opposite to the first direction DR1. The second protruding portion PP2 may be positioned outside the scan line 111 in the second direction DR2 in a plan view. Accordingly, a width of the boosting capacitor CBT in the second direction DR2 may be determined by the width W2 of the scan line 111 in the second direction DR2 in the region in which the scan line 111 and the second active layer ACT2 overlap each other.

The first compensation control line 121 and the second active layer ACT2 may form a compensation transistor capacitor T3C in a region in which the first compensation control line 121 and the second active layer ACT2 overlap each other. The compensation transistor capacitor T3C may be an internal capacitor of the compensation transistor T3. A planar area of the compensation transistor capacitor T3C may be determined by a width W3 of the second active layer ACT2 in the first direction DR1 and a width W4 of the first compensation control line 121 in the second direction DR2 in the region in which the first compensation control line 121 and the second active layer ACT2 overlap each other. Specifically, the region, in which the first compensation control line 121 and the second active layer ACT2 overlap each other, may have a substantially rectangular shape. A first side of the rectangular shape may correspond to the width W3 of the second active layer ACT2 in the first direction DR1, and a second side of the rectangular shape perpendicular to the first side may correspond to the width W4 of the first compensation control line 121 in the second direction DR2.

The first compensation control line 121 may include a third protruding portion PP3 protruding in the second direction DR2. Specifically, the third protruding portion PP3 may be a portion of the first compensation control line 121 which protrudes in the second direction DR2 or in a direction opposite to the second direction DR2. The third protruding portion PP3 may be positioned outside the second active layer ACT2 in the first direction DR1 in a plan view. Accordingly, a width of the compensation transistor capacitor T3C in the first direction DR1 may be determined by the width W3 of the second active layer ACT2 in the first direction DR1 in the region in which the first compensation control line 121 and the second active layer ACT2 overlap each other.

The boosting capacitor CBT and the compensation transistor capacitor T3C induce a kickback voltage of the gate electrode of the driving transistor T1, and the boosting capacitor CBT and the compensation transistor capacitor T3C may induce kickback voltages of different polarities. The kickback voltage refers to an unintended voltage caused by capacitance between overlapping conductive layers. For example, the boosting capacitor CBT may induce a positive (+) kickback voltage, and the compensation transistor capacitor T3C may induce a negative (−) kickback voltage. Further, a capacitance of the boosting capacitor CBT may be proportional to the planar area of the boosting capacitor CBT, and a capacitance of the compensation transistor capacitor T3C may be proportional to the planar area of the compensation transistor capacitor T3C.

In the prior art, a width of the compensation transistor capacitor T3C in the first direction DR1 may be determined by the second active layer ACT2, however, a width of the boosting capacitor CBT in the first direction DR1 may be determined by the scan line 111 or by a combination of the scan line 111 and the second active layer ACT2. Accordingly, in the prior art, the correlation between the planar area of the boosting capacitor CBT and the planar area of the compensation transistor capacitor T3C may be relatively low, and accordingly, the deviation of the kickback voltage may increase. When the deviation of the kickback voltage increases, stains may occur in the display device. When the deviation of the kickback voltage increases, a difference between luminances of the pixels PX may occur, and the difference between the luminances of the pixels PX may be recognized as the stains.

In the present inventive concept, the width of the boosting capacitor CBT in the first direction DR1 and the width of the compensation transistor capacitor T3C in the first direction DR1 may be determined by the second active layer ACT2. Accordingly, in the present inventive concept, the correlation between the planar area of the boosting capacitor CBT and the planar area of the compensation transistor capacitor T3C may be relatively high, and accordingly, the deviation of the kickback voltage may be reduced. Accordingly, occurrence of stains in the display device may be reduced or substantially prevented.

Figure 12:
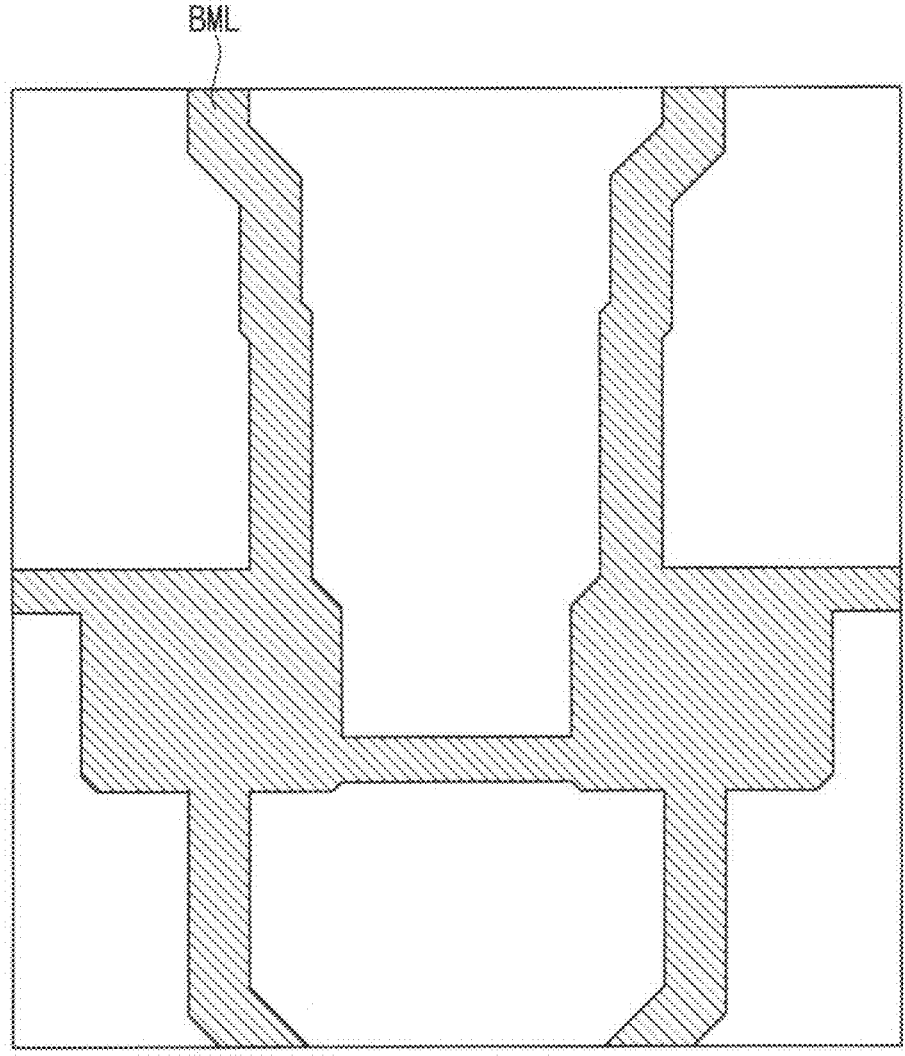
FIG. 12 is a plan view illustrating a lower wiring of a display device according to an embodiment.
Figure 12:
Figure 13:
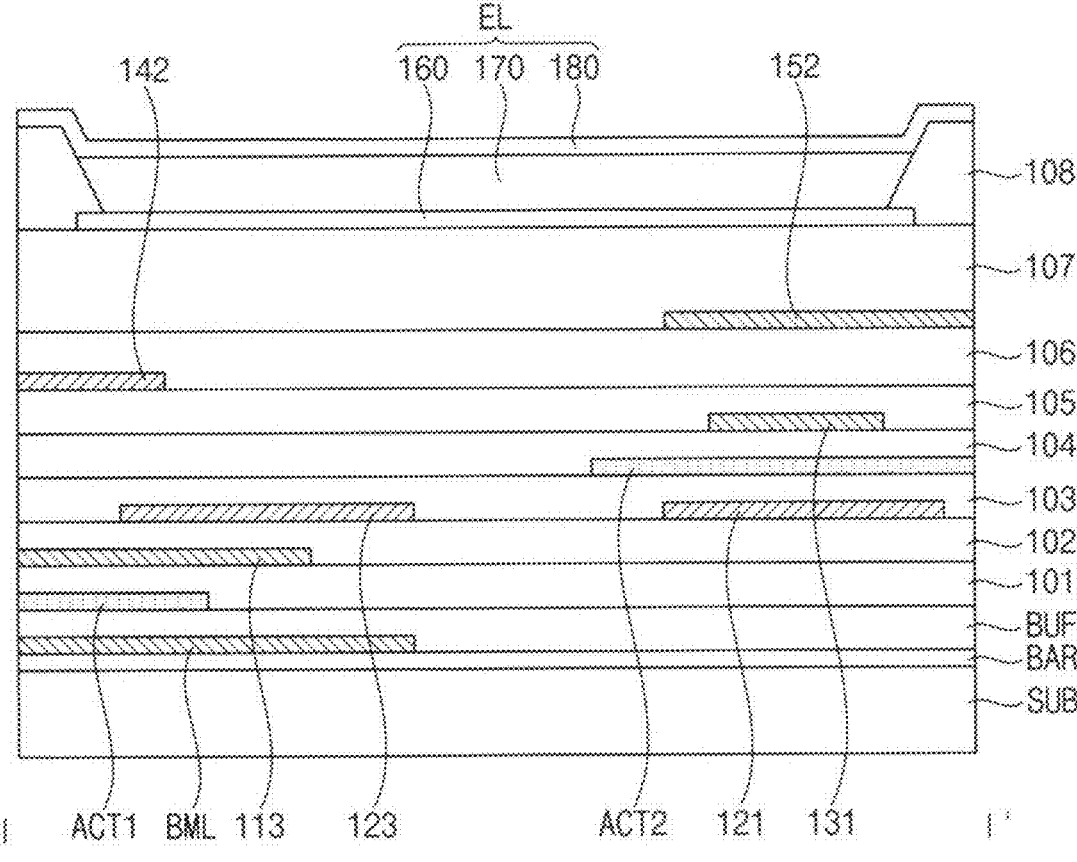
FIG. 13 is a cross-sectional view illustrating the display device taken along the line I-I' in FIG. 9.

FIG. 12 is a plan view illustrating a lower wiring of a display device according to an embodiment. FIG. 13 is a cross-sectional view illustrating the display device taken along the line I-I' in FIG. 9.

Referring to FIGS. 3, 4, 5, 6, 7, 8, 9, 12, and 13, a display device may include a lower wiring BML, a first active layer ACT1, a first conductive layer 110, a second conductive layer 120, a second active layer ACT2, a third conductive layer 130, a fourth conductive layer 140, a fifth conductive layer 150, a first electrode 160, an emission layer 170, and a second electrode 180, which are disposed on a substrate SUB. The display device described with reference to FIGS. 3 to 9, 12, and 13 may be substantially the same as or similar to the display device described with reference to FIGS. 3 to 11 except for the addition of the lower wiring BML. Accordingly, descriptions on components of the display device described with reference to FIGS. 3 to 9, 12, and 13, which are substantially the same as or similar to those of the display device described with reference to FIGS. 3 to 11, will not be repeated.

The lower wiring BML may be disposed between the substrate SUB and the buffer layer BUF. The lower wiring BML may include a conductive material such as molybdenum (Mo), copper (Cu), aluminum (Al), titanium (Ti) etc., or amorphous silicon.

The lower wiring BML may overlap the first conductive pattern 113. The lower wiring BML may be disposed under the driving transistor T1. Specifically, the lower wiring BML may be disposed under a portion of the first active layer ACT1 which overlaps the first conductive pattern 113.

When an electric field due to polarization of the substrate SUB containing polyimide is formed between the driving transistor T1 and the substrate SUB through under the driving transistor T1, the characteristics of the driving transistor T1 may change, and thus, the brightness of light emitted from the light emitting element EL may change. When the lower wiring BML is disposed under the portion of the first active layer ACT1 which overlaps the first conductive pattern 113, the lower wiring BML may prevent an electric field from being formed between the first active layer ACT1 and the substrate SUB through under the driving transistor T1. Accordingly, the characteristics of the driving transistor T1 may not change, and the brightness of light emitted from the light emitting element EL may constantly maintain.

In an embodiment, the lower wiring BML may be connected to the gate electrode, the first electrode, or the second electrode of the driving transistor T1. In an embodiment, the lower wiring BML may receive the driving voltage ELVDD in FIG. 2, the first initialization voltage VINT in FIG. 2, or the second initialization voltage AINT in FIG. 2.

A barrier layer BAR may be disposed between the substrate SUB and the lower wiring BML. The barrier layer BAR may block diffusion of impurities such as oxygen, moisture, or the like through the substrate SUB to above the substrate SUB. Further, the barrier layer BAR may provide a planarized upper surface on the substrate SUB. The barrier layer BAR may include an inorganic insulation material such as silicon oxide, silicon nitride, silicon oxynitride, or the like. Alternatively, the barrier layer BAR may be omitted.

Figure 14:
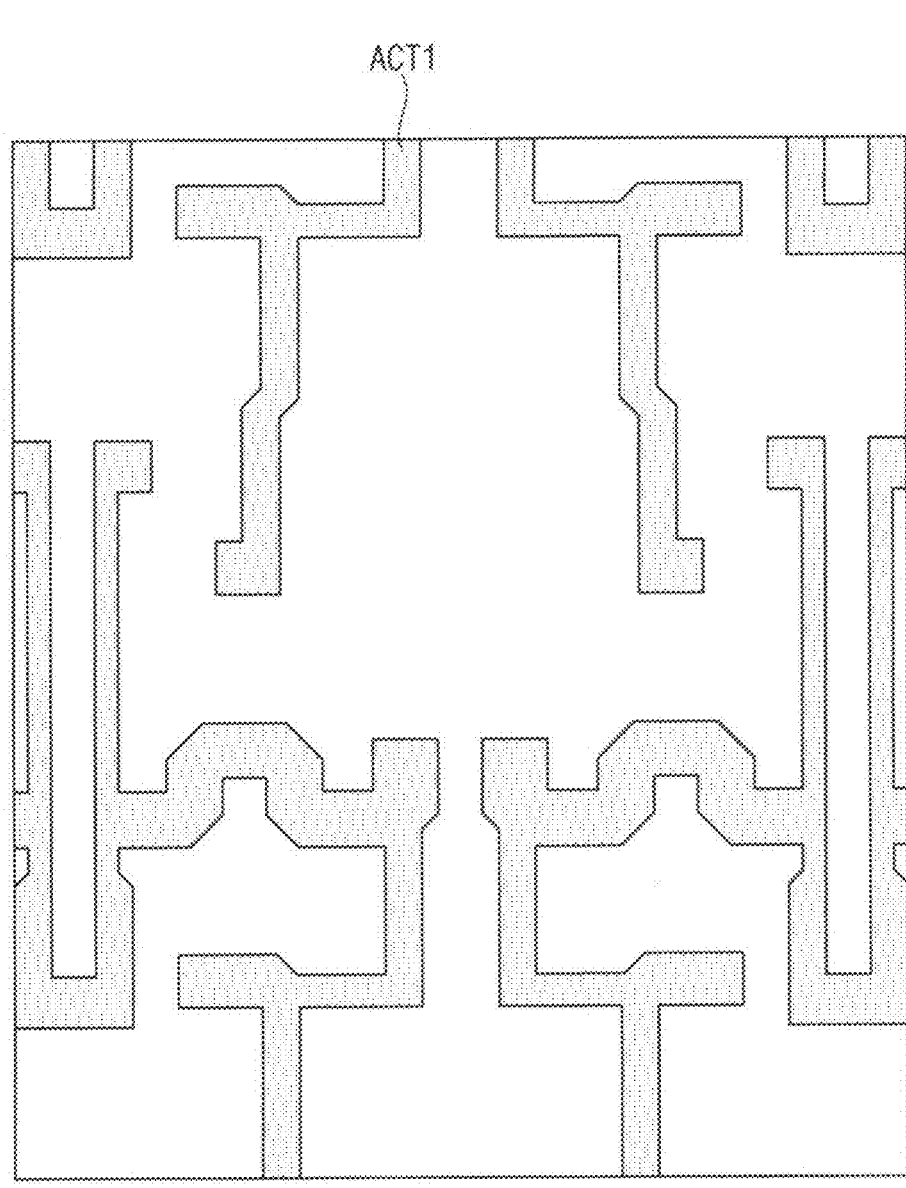
FIG. 14 is a plan view illustrating a first active layer of a display device according to an embodiment.
Figure 14:
Figure 15:
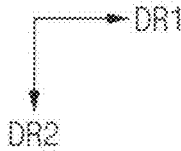
FIG. 15 is a plan view illustrating a first conductive layer of a display device according to an embodiment.
Figure 16:
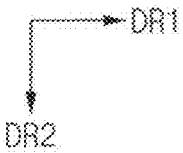
FIG. 16 is a plan view illustrating a second conductive layer of a display device according to an embodiment.
Figure 17:
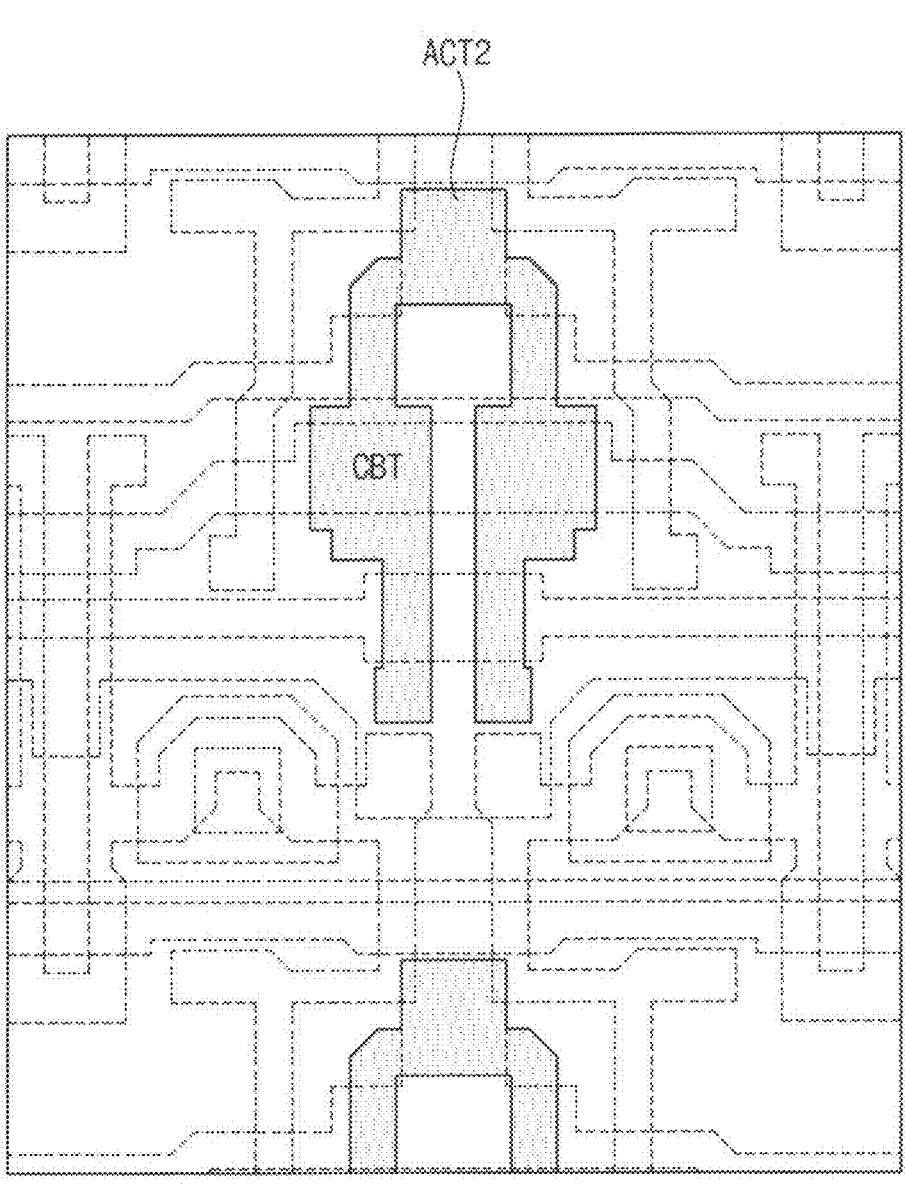
FIG. 17 is a plan view illustrating a second active layer of a display device according to an embodiment.
Figure 17:
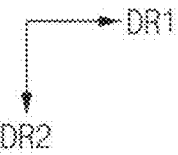
Figure 18:
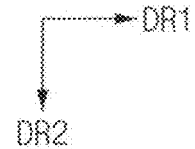
FIG. 18 is a plan view illustrating a third conductive layer of a display device according to an embodiment.
Figure 19:
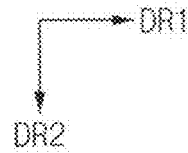
FIG. 19 is a plan view illustrating a fourth conductive layer of a display device according to an embodiment.
Figure 20:
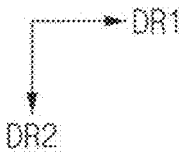
FIG. 20 is a plan view illustrating a fifth conductive layer of a display device according to an embodiment.

FIG. 14 is a plan view illustrating a first active layer ACT1 of a display device according to an embodiment. FIG. 15 is a plan view illustrating a first conductive layer 110 of a display device according to an embodiment. FIG. 16 is a plan view illustrating a second conductive layer 120 of a display device according to an embodiment. FIG. 17 is a plan view illustrating a second active layer ACT2 of a display device according to an embodiment. FIG. 18 is a plan view illustrating a third conductive layer 130 of a display device according to an embodiment. FIG. 19 is a plan view illustrating a fourth conductive layer 140 of a display device according to an embodiment. FIG. 20 is a plan view illustrating a fifth conductive layer 150 of a display device according to an embodiment.

Referring to FIGS. 14, 15, 16, 17, 18, 19, and 20, a display device may include a first active layer ACT1, a first conductive layer 110, a second conductive layer 120, a second active layer ACT2, a third conductive layer 130, a fourth conductive layer 140, a fifth conductive layer 150, a first electrode, an emission layer, and a second electrode, which are disposed on a substrate SUB. Descriptions on components of the display device described with reference to FIGS. 14 to 20, which are substantially the same as or similar to those of the display device described with reference to FIGS. 3 to 11, will not be repeated.

The second conductive layer 120 may include a first compensation control line 121, a first initialization control line 122, and a second conductive pattern 123.

The third conductive layer 130 may include a second compensation control line 131, a second initialization control line 132, a first initialization voltage line 133, and a second gate connection electrode 134. The first initialization voltage line 133 may be spaced apart from the second initialization control line 132, and may extend in the first direction DR1. The second gate connection electrode 134 may overlap the first conductive pattern 113. The second gate connection electrode 134 may be connected to the first conductive pattern 113 through a contact hole.

The fourth conductive layer 140 may include a second initialization voltage line 141, a first gate connection electrode 142, an active connection electrode 143, a data connection electrode 144, a driving voltage connection electrode 145, a first light emitting element connection electrode 146, and a first bridge line 148.

The first gate connection electrode 142 may be connected to the second gate connection electrode 134 and the second active layer ACT2 through contact holes, respectively. Accordingly, the first gate connection electrode 142 and the second gate connection electrode 134 may connect the gate electrode of the driving transistor T1, the second electrode of the compensation transistor T3, and the second electrode of the first initialization transistor T4.

The first bridge line 148 may be spaced apart from the first light emitting element connection electrode 146. The first bridge line 148 may extend in the first direction DR1.

The fifth conductive layer 150 may include a data line 151, a driving voltage line 152, a second light emitting element connection electrode 153, and a second bridge line 154. The second bridge line 154 may be spaced apart from the second light emitting element connection electrode 153. The second bridge line 154 may extend in the second direction DR2.

In an embodiment, the first bridge line 148 and the second bridge line 154 may serve to transmit the data voltage DATA to the data line 151. For example, the first bridge line 148 and the second bridge line 154 may be connected to each other through a contact hole in a portion where the first bridge line 148 and the second bridge line 154 intersect, and the second bridge line 154 may be connected to a data driver generating the data voltage DATA. As the first bridge line 148 and the second bridge line 154 are additionally disposed, the number of data lines 151 connected to the data driver may decrease. Accordingly, a planar area of the data driver may decrease, and thus, a dead space of the display device may be reduced.

Figure 21:
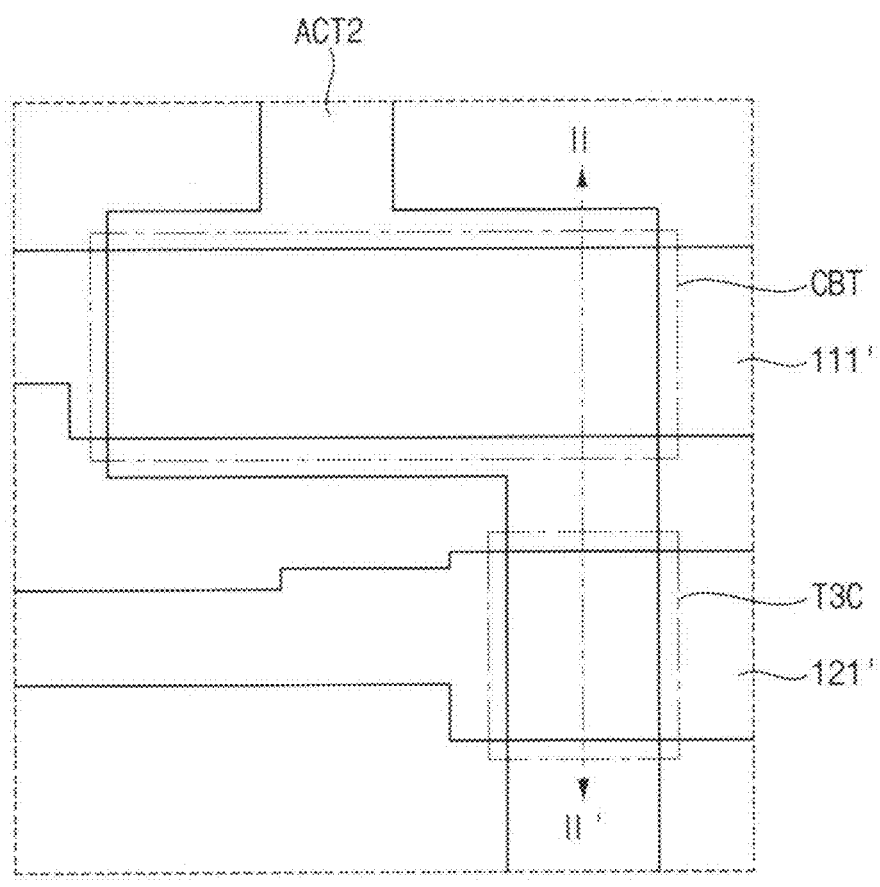
FIG. 21 is a layout view illustrating a display device according to an embodiment.
Figure 21:
Figure 22:
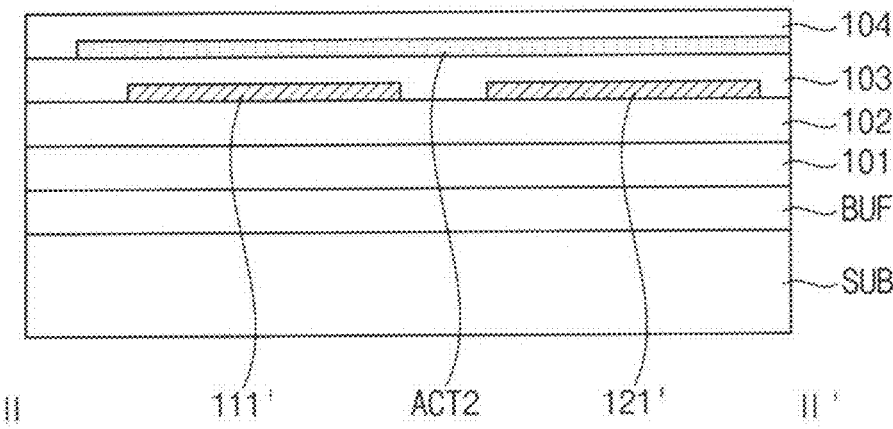
FIG. 22 is a cross-sectional view illustrating an example of the display device taken along a line II-II' in FIG. 21.
Figure 23:
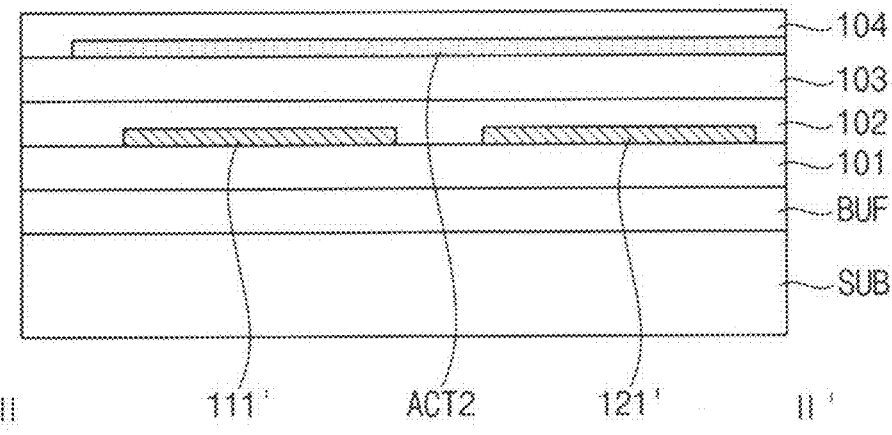
FIG. 23 is a cross-sectional view illustrating another example of the display device taken along the line II-II' in FIG. 21.

FIG. 21 is a layout view illustrating a display device according to an embodiment. FIG. 22 is a cross-sectional view illustrating an example of the display device taken along a line II-II' in FIG. 21. FIG. 23 is a cross-sectional view illustrating another example of the display device taken along the line II-II' in FIG. 21.

Descriptions on components of the display device described with reference to FIGS. 21 to 23, which are substantially the same as or similar to those of the display device described with reference to FIGS. 10 and 11, will not be repeated.

Referring to FIGS. 21, 22, and 23, the first compensation control line 121' may be disposed on the same layer as the scan line 111'. In an embodiment, as illustrated in FIG. 22, the scan line 111' and the first compensation control line 121' may be disposed between the second insulation layer 102 and the third insulation layer 103. In another embodiment, as illustrated in FIG. 23, the scan line 111' and the first compensation control line 121' may be disposed between the first insulation layer 101 and the second insulation layer 102.

In the present embodiment, the first electrode of the boosting capacitor CBT and the first electrode of the compensation transistor capacitor T3C may be disposed on the same layer, and the second electrode of the boosting capacitor CBT and the second electrode of the compensation transistor capacitor T3C may be disposed on the same layer. Accordingly, the correlation between the planar area of the boosting capacitor CBT determined by the scan line 111' and the second active layer ACT2 and the planar area of the compensation transistor capacitor T3C determined by the first compensation control line 121' and the second active layer ACT2 may be relatively high, and thus, the deviation of the kickback voltage may decrease.

The display device according to the embodiments may be applied to a display device included in a computer, a notebook, a mobile phone, a smart phone, a smart pad, a PMP, a PDA, an MP3 player, or the like.

Although the display devices according to the embodiments have been described with reference to the drawings, the illustrated embodiments are examples, and may be modified and changed by a person having ordinary knowledge in the relevant technical field without departing from the scope and spirit described in the following claims.

What is claimed is:

1. A mobile phone including a display device, the mobile phone comprising:
   a first active layer disposed on a substrate;
   a scan line disposed on the first active layer and extending in a first direction;
   a first compensation control line disposed on the first active layer, extending in the first direction, and spaced apart from the scan line in a second direction crossing the first direction; and
   a second active layer disposed on the scan line and the first compensation control line and overlapping the scan line and the first compensation control line,
   wherein a width in the first direction of a first portion of the second active layer which overlaps the scan line is greatest among widths in the first direction of portions of the second active layer.

2. The mobile phone of claim 1, wherein the width in the first direction of the first portion of the second active layer is greater than a width in the first direction of a second portion of the second active layer which overlaps the first compensation control line.

3. The mobile phone of claim 2, wherein the second portion of the second active layer has a rectangular shape in a plan view.

4. The mobile phone of claim 1, further comprising:
a first initialization control line disposed on the first active layer, extending in the first direction, and spaced apart from the scan line in the second direction,
wherein the width in the first direction of the first portion of the second active layer is greater than a width in the first direction of a third portion of the second active layer which overlaps the first initialization control line.

5. The mobile phone of claim 1, further comprising:
a first conductive pattern disposed on the first active layer and overlapping the first active layer; and
a first gate connection electrode disposed on the second active layer and connecting the second active layer and the first conductive pattern,
wherein a contact hole through which the first gate connection electrode contacts the second active layer overlaps the first portion of the second active layer.

6. The mobile phone of claim 5, further comprising:
a driving voltage line disposed on the first gate connection electrode and overlapping the first portion of the second active layer.

7. The mobile phone of claim 1, wherein the scan line is disposed on a same layer as the first compensation control line.

8. The mobile phone of claim 1, wherein a material of the first active layer is different from a material of the second active layer,
wherein the first active layer includes at least one of amorphous silicon and polycrystalline silicon, and
wherein the second active layer includes an oxide semiconductor.

9. A mobile phone including a display device, the mobile phone comprising:
a first active layer disposed on a substrate;
a scan line disposed on the first active layer and extending in a first direction;
a first compensation control line disposed on the first active layer, extending in the first direction, and spaced apart from the scan line in a second direction crossing the first direction; and
a second active layer disposed on the scan line and the first compensation control line and overlapping the scan line and the first compensation control line,
wherein a width in the first direction of a first portion of the second active layer which overlaps the scan line is greatest among widths in the first direction of portions of the second active layer, and
wherein the second active layer is connected in two adjacent pixels of the plurality of pixels.

10. The mobile phone of claim 9, further comprising:
a first initialization control line disposed on the first active layer, extending in the first direction, and spaced apart from the scan line in the second direction,
wherein the width in the first direction of the first portion of the second active layer is greater than a width in the first direction of a second portion of the second active layer which overlaps the first compensation control line and a width in the first direction of a third portion of the second active layer which overlaps the first initialization control line.

11. The mobile phone of claim 10, wherein the second portion of the second active layer has a rectangular shape in a plan view.

12. The mobile phone of claim 9, further comprising:
a first conductive pattern disposed on the first active layer and overlapping the first active layer; and
a first gate connection electrode disposed on the second active layer and connecting the second active layer and the first conductive pattern,
wherein a contact hole through which the first gate connection electrode contacts the second active layer overlaps the first portion of the second active layer.

13. The mobile phone of claim 12, further comprising:
a driving voltage line disposed on the first gate connection electrode and overlapping the first portion of the second active layer.

14. The mobile phone of claim 9, wherein the scan line is disposed on a same layer as the first compensation control line.

15. A mobile phone including a display device, the mobile phone comprising:
a first active layer disposed on a substrate;
a scan line disposed on the first active layer and extending in a first direction;
a first compensation control line disposed on the first active layer, extending in the first direction, and spaced apart from the scan line in a second direction crossing the first direction; and
a second active layer disposed on the scan line and the first compensation control line and overlapping the scan line and the first compensation control line,
wherein a width in the first direction of a first portion of the second active layer which overlaps the scan line is greatest among widths in the first direction of portions of the second active layer,
wherein the first active layer is separated for each of the plurality of pixels, and
wherein the second active layer is shared by adjacent pixels of the plurality of pixels.

16. The mobile phone of claim 15, further comprising:
a first initialization control line disposed on the first active layer, extending in the first direction, and spaced apart from the scan line in the second direction,
wherein the width in the first direction of the first portion of the second active layer is greater than a width in the first direction of a second portion of the second active layer which overlaps the first compensation control line and a width in the first direction of a third portion of the second active layer which overlaps the first initialization control line.

17. The mobile phone of claim 16, wherein the second portion of the second active layer has a rectangular shape in a plan view.

18. The mobile phone of claim 15, further comprising:
a first conductive pattern disposed on the first active layer and overlapping the first active layer; and
a first gate connection electrode disposed on the second active layer and connecting the second active layer and the first conductive pattern,
wherein a contact hole through which the first gate connection electrode contacts the second active layer overlaps the first portion of the second active layer.

19. The mobile phone of claim 18, further comprising:
a driving voltage line disposed on the first gate connection electrode and overlapping the first portion of the second active layer.

20. The mobile phone of claim 15, wherein the scan line is disposed on a same layer as the first compensation control line.

\* \* \* \* \*